Figure 1:
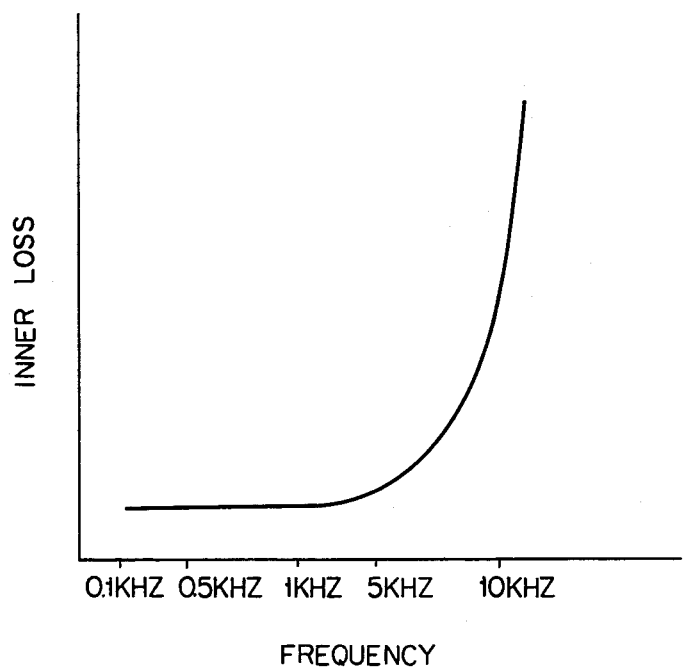

United States Patent [19]

Ishii

[11] 4,039,965
[45] Aug. 2, 1977

[54] AUDIO FREQUENCY TRANSISTOR AMPLIFIER

[75] Inventor: Kazuo Ishii, Tokyo, Japan

[73] Assignee: Tokyo Shibaura Electric Co., Ltd., Kawasaki, Japan

[21] Appl. No.: 678,554

[22] Filed: Apr. 20, 1976

[51] Int. Cl.² .................. H03F 3/18; H03F 3/183
[52] U.S. Cl. .......................... 330/13; 330/28; 330/149
[58] Field of Search .............. 330/13, 15, 28, 149

[56] References Cited
FOREIGN PATENT DOCUMENTS

| 1,901,433 | 6/1973 | Germany | 330/13 |
| 1,143,234 | 2/1963 | Germany | 330/22 |

*Primary Examiner*—James B. Mullins
*Attorney, Agent, or Firm*—Oblon, Fisher, Spivak, McClelland & Maier

[57] ABSTRACT

In an audio frequency transistor amplifier comprising an output amplifier circuit to be coupled to a load, a preceding stage amplifier circuit coupled to the input of the output amplifier circuit, and a negative feedback circuit including a DC blocking electrolytic capacitor or polarized capacitor coupled between the output amplifier circuit and the preceding stage amplifier circuit to feed the output signal of the output amplifier circuit back to the preceding stage amplifier circuit, the electrolytic capacitor, when an audio signal to be amplified is fed back to pass therethrough, generates harmonics of the audio signal due to its nonlinear property, thereby to cause a decrease in the articulation and resolution of reproduced sound. The invention resides in coupling in parallel, in order to eliminate or reduce the harmonic noises generated by the electrolytic capacitor, a nonpolarized capacitor having a much smaller loss than the electrolytic capacitor to the same. For the purpose of raising the harmonic noise eliminating or reducing effect, a plurality of nonpolarized capacitors may be coupled in parallel to the electrolytic capacitor.

10 Claims, 3 Drawing Figures

AUDIO FREQUENCY TRANSISTOR AMPLIFIER

This invention relates to an audio frequency transistor amplifier.

Generally, an audio frequency amplifier should be so designed as to amplify with high fidelity audio frequency electric signals obtained from an audio source such as a microphone, a disk, a tape or a radio receiver. The cause of interrupting the high fidelity amplification usually include the nonlinear distortion occurring upon passage of the electric signal through an active device such as a vacuum tube or a transistor, the cross modulation distortion caused by the electric signals having different frequencies, etc. The present development of semiconductor manufacturing technique and circuit design technique makes it possible to suppress the occurrence of the various distortions to a negligible level.

Even in the case of reproducing musical sounds by a conventional audio frequency transistor amplifier having a sufficiently low-distortion characteristic, however, satisfactory results cannot be necessarily obtained in the light of a listener's auditory sense. This is considered because the distortions or noises whose level is too low to measure by a measuring instrument are generated by the unknown causes in the amplifier, and are sensed by a listener's auditory sense. To explain in more detail, the reason is considered that a voice and a musical sound to be reproduced, as well known each have a very much complicated peculiar waveform, in other words each contain as a peculiar frequency spectrum a fundamental wave component and a number of harmonics components, and especially these harmonics are masked by, or interfere with, the noises generated by the unknown causes to cause a decrease in the articulation or resolution of a reproduced sound.

As a result of having conducted various experiments, the present inventor has found that nonlinear passive circuit elements, especially large-capacitance polarized capacitors or electrolytic capacitors which are necessarily used in a transistor amplifier because of a nature that a transistor is a current amplifier, plays an important role as the unknown noise generating source.

According to its known structure, the electrolytic capacitor has also a semiconductive property and therefore exhibits a nonlinear transfer characteristic (voltage versus current) as in a diode. Accordingly, the electrolytic capacitor with a DC voltage applied when an AC signal or audio signal is passing therethrough, generates harmonics of that AC signal. An aluminium electrolytic capacitor used in the transistor amplifier because of its large capacitance and relatively low cost has, as shown in FIG. 1, a nonlinear loss characteristic wherein the inner loss including a dielectric loss tan δ and electrode losses attributed to the electrode structure nonlinearly and rapidly increases over a range from an intermediate frequency range to a high frequency ranges Besides, when the voltage applied to the electrolytic capacitor is increased, the inner loss thereof is increased.

The fact that the inner loss of the electrolytic capacitor increases with an increase in frequency means that the loss resistance thereof increases with an increase in frequency. Accordingly, the fact that the electrolytic capacitor generates, in accordance with its nonlinear transfer characteristic, harmonics of an audio signal passing therethrough and that the loss resistance thereof increases with an increase in the frequency can be sufficient basis for considering the electrolytic capacitor to be a source of noises having relatively high frequencies (in this specification, these noises are hereinafter referred to as "harmonic noises").

In addition, the fact that when the applied voltage to the electrolytic capacitor increases the inner loss thereof also increases means that, in the transistor amplifier, the electrolytic capacitor used in the circuit portion to which a relativley high voltage is applied has a great effect upon the elevation of quality of the amplifier. Accordingly, the existence of decoupling electrolytic capacitors in a power source circuit are supposed to greatly influence the quality of the transistor amplifier. Elimination or reduction of the harmonic noises generated by the electrolytic capacitors in the power source circuit is stated in the copending application Ser. No. 629,223 filed on Nov. 6, 1975 and assigned to the same assignee as this invention. On the other hand, the present inventor has newly found that in the transistor amplifier the existence of an electrolytic capacitor in a negative feedback circuit for effecting a negative feedback from an output amplifier circuit to a preceding stage amplifier circuit also has a great effect upon the quality of a reproduced sound. That is, when it is assumed that undesirable harmonic noises are generated by the negative feedback circuit, these noises are fed back to the preceding stage amplifier circuit to produce an adverse effect that in the succeeding stage output circuit those noises are increased. This invention has been achieved with attention paid to that negative feedback electrolytic capacitor.

Accordingly, the object of the invention is to provide an audio frequency transistor amplifier capable of eliminating or reducing the harmonic noises generated by an electrolytic capacitor used in a negative feedback circuit.

The above object of the invention can be achieved by coupling in parallel a nonpolarized capacitor to the electrolytic capacitor.

It is well known that a nonpolarized capacitor has a much smaller loss than an electrolytic capacitor, and this nonpolarized capacitor can be chosen to have a capacitance value sufficient to bypass or shunt the harmonic noises, i.e., a capacitance value smaller than that of the electrolytic capacitor. As the nonpolarized capacitor a paper capacitor, a metalized paper capacitor or a plastic film capacitor can be used.

The principle of the invention for eliminating or reducing the harmonic noises generated by the electrolytic capacitor lies in absorbing or shortcircuiting the harmonic noises generated by the electrolytic capacitor upon passage therethrough of a signal to be amplified and appearing across the loss resistance by means of the nonpolarized capacitor having a small-loss resistance and a reactance sufficiently low with respect to the harmonic noises.

The nonpolarized capacitor exhibits such a nonlinear property as mentioned above although to a much smaller extent than in the case of the electrolytic capacitor, and there is a possibility of the nonpolarized capacitor also generating harmonic noises (whose lowest frequency is higher than that of the harmonic noises generated by the electrolytic capacitor). In order to eliminate or reduce the harmonic noises generated by this first nonpolarized capacitor, a second nonpolarized capacitor having a smaller loss and capacitance value may be coupled in parallel to the first nonpolarized capacitor. Further, a third nonpolarized capacitor having a smaller loss and capacitance value than the second nonpolarized capacitor may be coupled in parallel thereto.

The subject matter of the invention does not reside in using a costly special circuit arrangement but in simply coupling in parallel at least one nonpolarized capacitor to the electrolytic capacitor of a negative feedback circuit for the purpose of eliminating or reducing the harmonic noises. Unfortunately, however, difficulties are encountered in quantitatively showing the effect of this invention since a measuring technique therefor has not yet been established.

It is believed, however, that an experienced audio engineer would be able to aurally confirm with ease the effect of the invention through a very simple experiment of parallel coupling a nonpolarized capacitor to the electrolytic capacitor of the negative feedback circuit used in an existing transistor amplifier.

Figure 3:
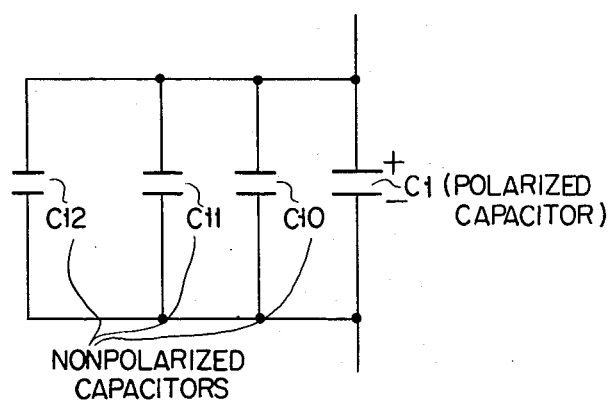
Figure 2:
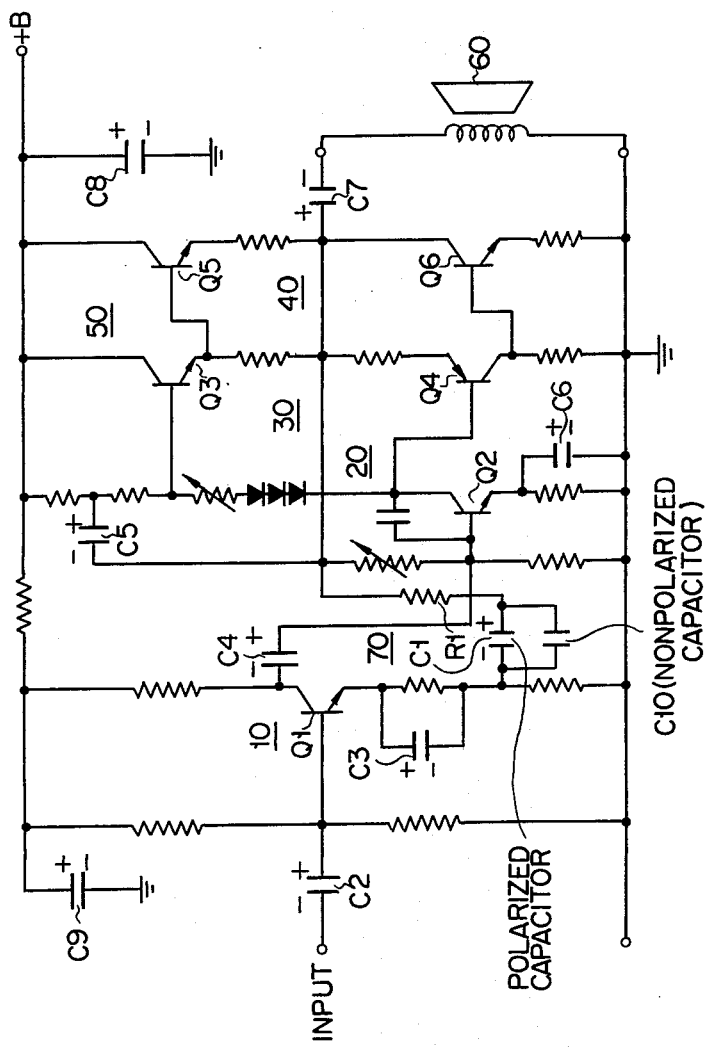

This invention can be more fully understood from the following detailed description when taken in conjunction with the accompanying drawings, in which:

FIG. 1 is a curve diagram showing an inner loss-to-frequency characteristic of an electrolytic capacitor;

FIG. 2 shows a transistor amplifier according to an embodiment of the invention wherein a nonpolarized capacitor is coupled in parallel to a negative feedback electrolytic capacitor in order to eliminate or reduce harmonic noises in accordance with the invention; and FIG. 3 shows another embodiment of the invention wherein a plurality of nonpolarized capacitors are coupled in parallel to the negative feedback electrolytic capacitor in order to elevate the harmonic noise eliminating or reducing effect of the invention.

FIG. 2 shows the case where the invention is applied to a negative feedback DC blocking electrolytic capacitor used in a known transistor amplifier including a quasi-complementary single-ended push-pull output circuit, but detailed description of the known transistor amplifier is believed to be unnecessary.

The transistor amplifier of FIG. 2 comprises a predriver amplifier circuit 10 including a transistor Q1 and coupled to receive an input signal to be amplified and reproduced, a driver amplifier circuit 20 including a transistor Q2 and coupled to the output of the predriver circuit 10, and a quasi-complementary push-pull output circuit 50 including a complementary amplifier stage 30 having a pair of complementary transistors Q3 and Q4 and an output amplifier stage 40 having transistors Q5 and Q6. The output amplifier stage 40 may be coupled to a load such as a loudspeaker 60.

As a matter of course, the transistor amplifier of FIG. 2 has a negative feedback circuit, and the output signal of the amplifier stage 40 or output circuit 50 is fed by a negative feedback circuit 70 including a resistor R1 and a DC blocking electrolytic capacitor C1 having a capacitance of 100 to 200 microfarads back to the predriver amplifier circuit 10 disposed on the input side of the output circuit 50 to constitute a preceding stage amplifier circuit.

The transistor amplifier of FIG. 2 further comprises, in addition to the negative feedback DC blocking electrolytic capacitor C1, a coupling electrolytic capacitor C2 having a capacitance of, for example, about 10 microfarads for coupling the input signal to the predriver amplifier circuit 10, an emitter bypass electrolytic capacitor C3 of the transistor Q1, a coupling electrolytic capacitor C4 having a capacitance of, for example, 10 microfarads for coupling the output signal of the predriver amplifier stage 10 to the driver amplifier circuit 20, a bootstrap electrolytic capacitor C5 having a capacitance of, for example, 10 microfarads, an emitter bypass electrolytic capacitor C6 of the transistor Q2, a coupling electrolytic capacitor C7 having a capacitance of, for example, 1000 microfarads for coupling the output circuit 50 to the loudspeaker 60, and decoupling capacitors C8 and C9 coupled to a power source circuit.

The negative feedback DC blocking electrolytic capacitor C1 is applied with a relatively high voltage from the output circuit 50 and the harmonic noises generated by the electrolytic capacitor C1 are amplified by the predriver and driver amplifier circuits 10 and 20 to be coupled in turn to the output circuit 50. In view of this the present inventor has found it important to the elevation of the quality of the amplifier to eliminate or reduce especially the harmonic noises generated by the electrolytic capacitor C1. According to the invention, therefore, a nonpolarized capacitor C10 such as a paper capacitor, a metalized paper capacitor or a plastic film capacitor is coupled in parallel to the electrolytic capacitor C1. Any one of these nonpolarized capacitors has a much smaller loss than the electrolytic capacitor C1, and, when chosen to have a capacitance of several microfarads, permits an effective shortcircuit and absorption of the harmonic noises generated in the electrolytic capacitor C1 upon passage of an audio signal through the polarized capacitor C1. The nonpolarized capacitor has a nonlinear property although very small as compared with that of the electrolytic capacitor. For this reason, also when an audio signal passes through the nonpolarized capacitor, the harmonic noises having a low level than in the case of the electrolytic capacitor are generated in the nonpolarized capacitor. Elimination or reduction of the harmonic noises generated by this first nonpolarized capacitor is also desirable to the elevation of articulation and resolution of a reproduced sound. Preferably, therefore, a second nonpolarized capacitor having a smaller loss than the first nonpolarized capacitor and having a capacitance (which may be smaller than that of the first nonpolarized capacitor) large enough to shortcircuit the harmonic noises generated by the first nonpolarized capacitor is coupled in parallel to the first nonpolarized capacitor. Further, in order to eliminate or reduce the harmonic noises generated by the second nonpolarized capacitor, a third nonpolarized capacitor may be coupled in parallel to the first and second nonpolarized capacitors.

In this way, in order to more increase the harmonic noise eliminating or reducing effect, a plurality of nonpolarized capacitors may preferably be coupled in parallel to the electrolytic capacitor as shown in FIG. 3. For instance, according to an embodiment wherein a polyethylene terephthalate film capacitor having a capacitance of about 2.2 microfarads is used as the first nonpolarized capacitor C10 being coupled in parallel to the electrolytic capacitor C1; a polypropylene film capacitor having a capacitance of about 0.15 microfarad and having a smaller loss than the polyethylene terephthalate film capacitor is used as the second nonpolarized capacitor C11 being coupled in parallel to the electrolytic capacitor C1; and a polystyrene film capacitor having a capacitance of about 0.01 microfarad and having a smaller loss than the two capacitors is used as the third nonpolarized capacitor C12 being coupled in parallel to the electrolytic capacitor C1, the result which is more satisfactory in terms of aural sense was obtained.

As above described, according to the invention, mere parallel coupling of at least one nonpolarized capacitor to the negative feedback DC blocking electrolytic capacitor enables an increase in the articulation and resolution of a reproduced sound, to provide a very great economical advantage.

Apparently, the invention can be applied not only to an amplifier using bipolar transistors but applied also to an amplifier using unipolar transistors in the case where the electrolytic capacitor is used. Further, the invention can be applied also to an amplifier using a complementary symmetry push-pull output circuit and can be further applied to an amplifier used for recording audio signals on a recording medium as well as to an amplifier for driving a loudspeaker.

What is claimed is:

1. A transistor amplifier for amplifying audio frequency signals comprising:
   an output amplifier circuit to be coupled to a load,
   a preceding stage amplifier circuit coupled to the input of said output amplifier circuit,
   a negative feedback circuit including a DC blocking electrolytic capacitor having input and output terminals coupled between said output amplifier circuit and said preceding stage amplifier circuit, said electrolytic capacitor generating undesirable harmonics of said audio frequency signals whereby the audio fidelity of said transistor amplifier is reduced; and,
   a first nonpolarized capacitor connected directly between said input and output terminals in parallel with said electrolytic capacitor for short circuiting said undesirable harmonics and enhancing the fidelity of said transistor amplifier.

2. An audio frequency transistor amplifier according to claim 1, wherein said first nonpolarized capacitor has a smaller capacitance than said electrolytic capacitor.

3. An audio frequency transistor amplifier according to claim 1, wherein said first nonpolarized capacitor is a paper capacitor.

4. An audio frequency transistor amplifier according to claim 1, wherein said first nonpolarized capacitor is a metalized paper capacitor.

5. An audio frequency transistor amplifier according to claim 1, wherein said first nonpolarized capacitor is a plastic film capacitor.

6. An audio frequency transistor amplifier according to claim 1, wherein a second nonpolarized capacitor having a smaller loss than said first nonpolarized capacitor is coupled in parallel to said first nonpolarized capacitor.

7. An audio frequency transistor amplifier according to claim 6, wherein said second nonpolarized capacitor has a smaller capacitance than said first nonpolarized capacitor.

8. An audio frequency transistor amplifier according to claim 6, wherein a third nonpolarized capacitor having a smaller loss than said second nonpolarized capacitor is coupled in parallel with said second nonpolarized capacitor.

9. An audio frequency transistor amplifier according to claim 8, wherein said third nonpolarized capacitor has a smaller capacitance than said second nonpolarized capacitor.

10. A transistor amplifier for amplifying audio frequency signals comprising:
    a predriver amplifier circuit coupled to receive an audio input signal;
    a driver amplifier circuit coupled to the output of said predriver amplifier circuit;
    a complementary push-pull output amplifier circuit coupled to the output of said driver amplifier circuit;
    a negative feedback circuit including a DC blocking electrolytic capacitor having input and output terminals coupled between said complementary push-pull output amplifier circuit and said predriver amplifier circuit, said electrolytic capacitor generating undesirable harmonics of said audio frequency signals whereby the audio fidelity of said transistor amplifier is reduced; and,
    at least one nonpolarized capacitor connected directly between said input and output terminals with said electrolytic capacitor for short circuiting said undesirable harmonics and enhancing the fidelity of said transistor amplifier.

* * * * *